(12) United States Patent
Park et al.

(10) Patent No.: US 8,197,717 B2
(45) Date of Patent: Jun. 12, 2012

(54) METAL INK FOR INK-JET PRINTING

(75) Inventors: Jung-Ho Park, Daejeon Metropolitan (KR); Joon-Hyung Kim, Daejeon Metropolitan (KR)

(73) Assignee: LG Chem, Ltd., Seoul (KR)

( * ) Notice: Subject to any disclaimer, the term of this patent is extended or adjusted under 35 U.S.C. 154(b) by 606 days.

(21) Appl. No.: 12/314,853

(22) Filed: Dec. 17, 2008

(65) Prior Publication Data

US 2009/0176013 A1 Jul. 9, 2009

(30) Foreign Application Priority Data

Dec. 18, 2007 (KR) .................. 10-2007-0133670

(51) Int. Cl.
*H01B 1/20* (2006.01)
(52) U.S. Cl. .................. 252/512; 252/514; 252/518.1
(58) Field of Classification Search .......... 252/512–514, 252/518.1
See application file for complete search history.

(56) References Cited

U.S. PATENT DOCUMENTS

| 2005/0173680 A1 | 8/2005 | Yang |
| 2007/0283848 A1 | 12/2007 | Kim et al. |
| 2007/0289483 A1* | 12/2007 | Cho et al. .................. 106/31.13 |

FOREIGN PATENT DOCUMENTS

| JP | 2005-229109 A | 8/2005 |
| JP | 2007-031799 | 2/2007 |
| JP | 2007-327034 A | 12/2007 |
| KR | 10-2006-0043182 | 5/2006 |
| KR | 10-0777662 B1 | 11/2007 |

OTHER PUBLICATIONS

Guo et al "Highly monodisperse polymer-capped ZnO nanoparticles; Preparation and optical properties", Applied Physics Letters 76(20) May 2000 pp. 2901-2903.*
Saraswathi Amma et al "Comparison of various organic stabilizers as capping agents for CdS nanoparticle systhesis", J. Mater Sci: Mater Electron (2007) 18:1109-1113.*
Pastoria-Santos et al "Formation of PVP-protected Metal Nanoparticles in DMF", Langmuir 2002, 18, 2888-2894.*
Leppert et al "Structural and optical characteristics of ZnSe nanocrystals . . . ", Materials Science and Engineering B52 (1998) 89-92.*
Lee et al "Solvent Compatibility . . . ", Anal Chem 2003, 75, 6544-6554.*

* cited by examiner

*Primary Examiner* — Mark Kopec
(74) *Attorney, Agent, or Firm* — McKenna Long & Aldridge LLP

(57) ABSTRACT

The present invention relates to a metal ink that comprises metal nano particles that are capped by a capping material; and an organic solvent that has a solubility parameter for swelling the capping material. In addition, the present invention relates to a method for producing a metal wire, which comprises the steps of jetting the metal ink by using an ink-jet nozzle, drying the metal ink, and firing the metal ink.

6 Claims, 3 Drawing Sheets

[FIG. 1]
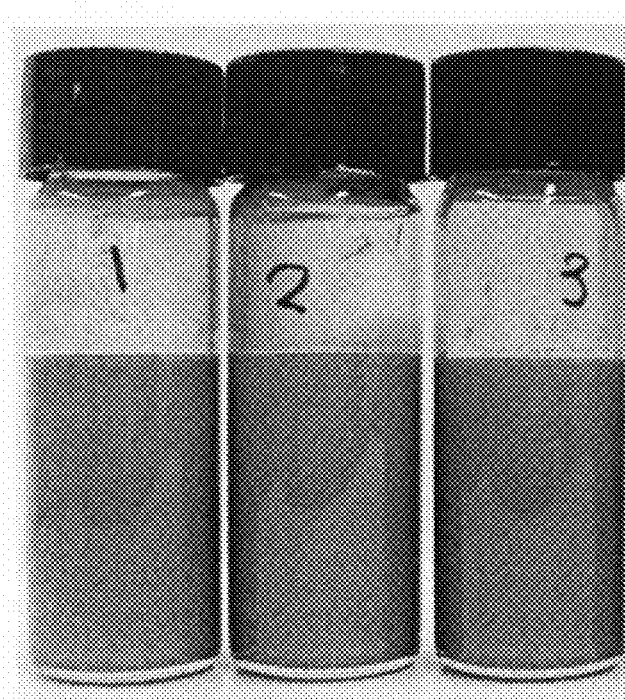
[FIG. 2]
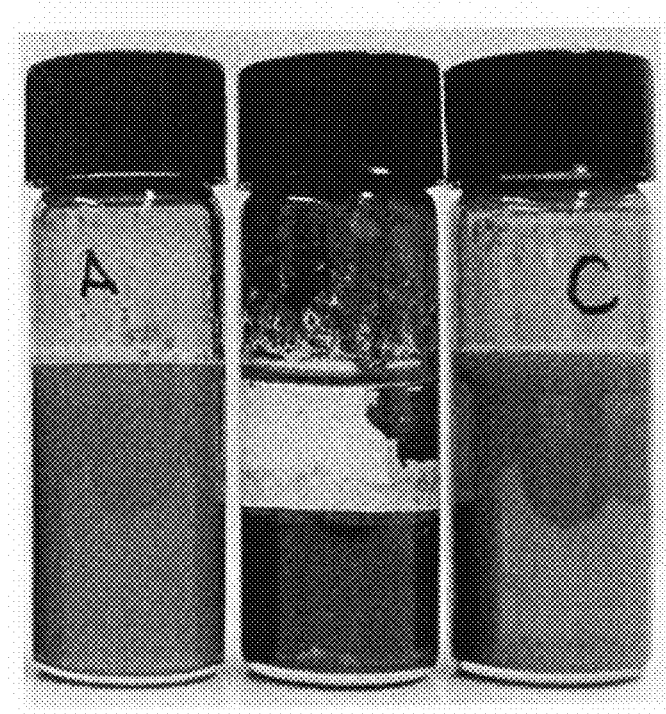

[FIG. 3]
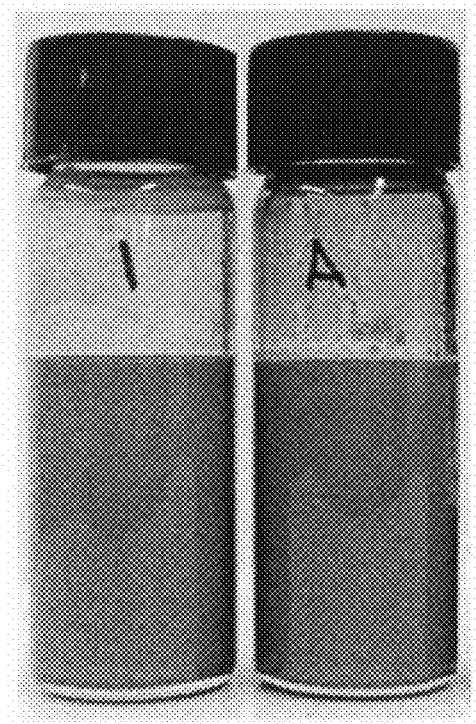
[FIG. 4]
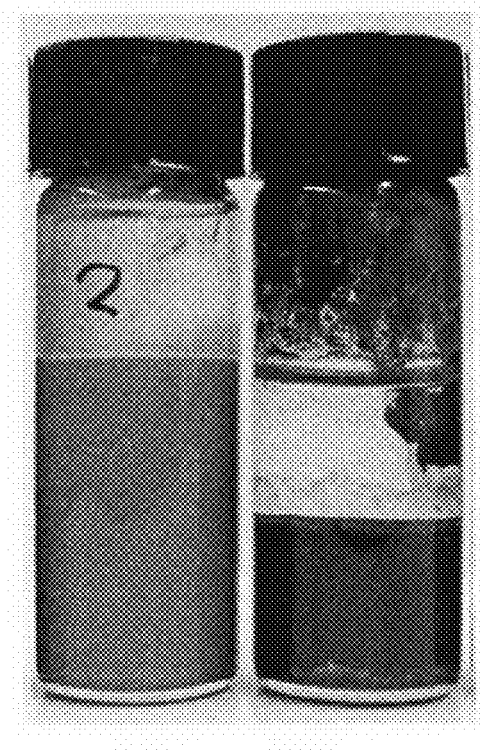

[FIG. 5]
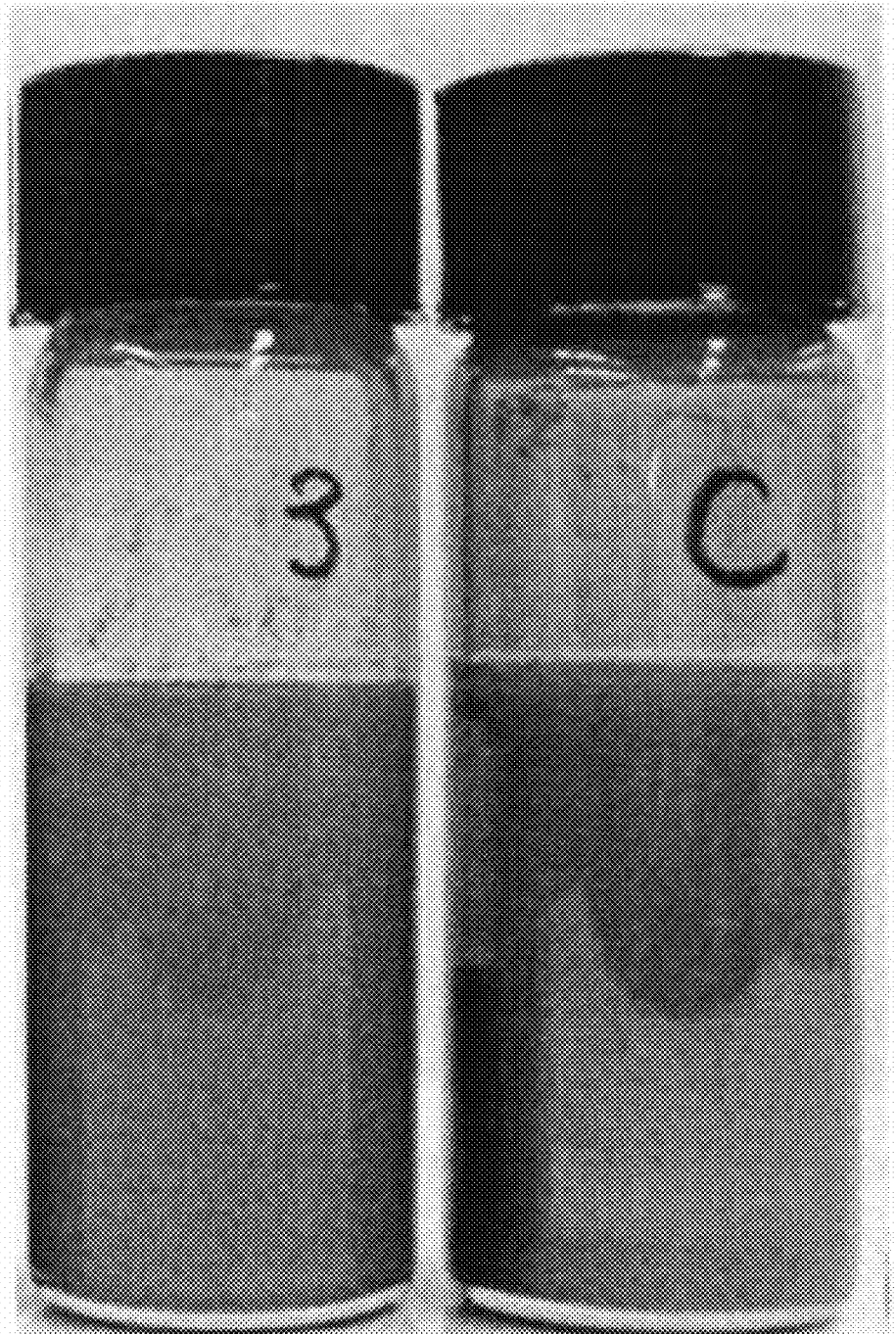

METAL INK FOR INK-JET PRINTING

This application claims priority to Korean Application No. 10-2007-0133670 filed on Dec. 18, 2007, of which is incorporated by reference, as if fully set forth herein.

BACKGROUND OF THE INVENTION

1. Field of the Invention

The present invention relates to a metal ink that includes a metal nano particle and an organic solvent, and a method for producing a metal wire by using the metal ink.

This application claims priority from Korean Patent Application No. 10-2007-0133670 filed on Dec. 18, 2007 in the KIPO, the disclosure of which is incorporated herein by reference in its entirety.

2. Description of the Related Art

Recently, in various fields of electronic part industries, an ink-jet printing process comes into the spotlight. The ink-jet printing process is a technology that is generally used in a document printing, but applied to various fields of electronic part development processes such as LCD color filters, RFID tags and the like, or the application to those fields is examined.

The printing of the conductive patterns such as RFID tags, PCB substrates, electrodes for PDP is carried out by spraying a conductive metal ink for ink-jet printing on a substrate.

The metal particle that is used in a general conductive metal ink for ink-jet printing is a single metal or an alloy of two or more metals, and single dispersion particles having the nano size are used so that firing is easily performed at low temperatures and the dispersion is well performed.

In order to synthesize the mono dispersed metal particle having the nanosize, a polyol process is mostly used. In the case of the metal particles that are synthesized by using the polyol process, in order to prevent the oxidation on the surface and to increase the dispersibility, a dispersing agent such as PVP (poly vinyl pyrrolidone) is capped. Accordingly, the conductive metal inks have largely different dispersibilities according to the characteristics of the solvent that is used in conjunction with the dispersing agent.

Korean Unexamined Patent Application Publication No. 2006-0043182 discloses that water and an watersoluble organic solvent are mixed with each other to prepare metal ink because of the dispersion of the metal ink and ease of the production of the metal ink. However, since water is a solvent having a very high surface tension, an operation for controlling the surface tension in order to make spraying possible is required. In addition, if the metal nano particles are contacted with water, since the oxidation occurs, there is a high risk in which the conductivity of the metal ink is reduced.

SUMMARY OF THE INVENTION

In order to solve the above problems, the present invention aims to maximize the dispersibility of the metal ink by selecting one or more solvents having a solubility parameter that is suitable in terms of relation with a capping material of metal nano particles when a solvent of a conductive metal ink for ink-jet printing, which includes metal nano particles capped by the capping material is determined.

The present invention provides a metal ink that comprises metal nano particles that are capped by a capping material; and an organic solvent that has a solubility parameter for swelling the capping material. It is preferable that the metal ink according to the present invention is a conductive metal ink for ink-jet printing.

In addition, the present invention provides a method for producing a metal wire, which comprises the steps of jetting the metal ink by using an ink-jet nozzle, drying the metal ink, and firing the metal ink.

According to the present invention, in a process for producing a conductive metal ink for ink-jet printing, by selecting a solvent that has a solubility parameter capable of swelling a capping material for capping metal nano particles, the dispersibility of the metal ink is maximized to increase storage stability and to minimize the agglomeration of the metal nano particles, thus improving the spraying property of the metal ink. Thereby, the performance property of the metal wire that is produced by using the metal ink may be improved.

DESCRIPTION OF THE DRAWINGS

FIG. 1 is a picture of inks that are produced in Example 1, Example 2 and Example 3 from a sample on the left side to a sample on the right side;

FIG. 2 is a picture of unstable inks that are produced in Comparative Example 1, Comparative Example 2 and Comparative Example 3 from a sample on the left side to a sample on the right side;

FIG. 3 is a comparison picture of inks that are produced in Example 1, and Comparative Example 1 from a sample on the left side to a sample on the right side;

FIG. 4 is a comparison picture of inks that are produced in Example 2, and Comparative Example 2 from a sample on the left side to a sample on the right side; and FIG. 5 is a comparison picture of inks that are produced in Example 3, and Comparative Example 3 from a sample on the left side to a sample on the right side.

DESCRIPTION OF THE PREFERRED EMBODIMENTS

Hereinafter, the present invention will be described in detail.

A metal ink according to the present invention includes metal nano particles that are capped by a capping material and an organic solvent, and the organic solvent has a solubility parameter for swelling the capping material. It is preferable that the metal ink according to the present invention is a conductive metal ink for ink-jet printing.

The metal ink according to the present invention includes a selected solvent in which the dispersibility of the metal nano particles is excellent in order to maximize the dispersibility of the ink, increase the storage stability, minimize the agglomeration of the metal nano particles to reduce troubles in a nozzle, and to improve the spraying property of the metal ink. At this time, as the solvent, by selecting an organic solvent having a solubility parameter that is suitable in terms of relation with the capping material of the metal nano particles, preferably, by selecting an organic solvent having a solubility parameter for swelling the capping material, the dispersibility of the metal nano particles in the organic solvent may be maximized. Here, the term "swelling" means a phenomenon in which a material absorbs a solvent and swells.

In order to synthesize the nano-size metal particles, a polyol process that is the most general method may be used, but the scope of the present invention is not limited thereto. In the case of the metal nano particles that are synthesized by using the polyol process, in order to prevent the oxidation on the surface of the metal nano particles and increase the dispersibility, the surface is surrounded by a dispersing agent such as PVP (polyvinyl pyrrolidone). At this time, this dispersing agent is called the capping material, and the surrounding by the dispersing agent is referred to as the capping by the capping material. The capping material functions to protect the metal nano particles and increase the dispersibility.

As described above, since the surface of the metal nano particles is uniformly covered by the capping material, the dispersibility of the metal nano particles may be determined by the capping material. The reason for this is why the solubility is increased according to the swelling property of the capping material and the dispersibility of the metal nano particles is increased as the solubility is increased. Accordingly, the selection of the solvent to disperse the metal nano particles is affected by the swelling property of the capping material rather than the property of the metal nano particles.

In the present invention, the solubility parameter for swelling the capping material is preferably in a range of solubility parameter of the capping material±1.8 $(cal/cm^3)^{1/2}$, more preferably in a range of solubility parameter of the capping material±0.6 $(cal/cm^3)^{1/2}$, more preferably in a range of solubility parameter of the capping material±0.4 $(cal/cm^3)^{1/2}$, more preferably in a range of solubility parameter of the capping material±0.25 $(cal/cm^3)^{1/2}$, and more preferably in a range of solubility parameter of the capping material±0.1 $(cal/cm^3)^{1/2}$.

When the solubility parameter of the organic solvent is similar to the solubility parameter of the capping material, that is, the polymer material capping the metal nano particles, the corresponding capping material may be easily swollen. In particular, in the case of when the capping material is PVP, if the solubility parameter of the organic solvent is in a range of 11.9±1.8 $(cal/cm^3)^{1/2}$, PVP may be swollen. In addition, in the case of when the solubility parameter value of the organic solvent is out of the range of swelling the capping material, that is, the polymer material capping the metal nano particles, the organic solvent is unsuitable as a solvent of the metal ink.

In the present invention, the organic solvent may be a single organic solvent or an organic solvent in which two or more solvents are mixed with each other. Illustrative, but non-limiting examples of the organic solvent include alcohols, glycols, polyols, glycol ethers, glycol ether esters, ketones, hydrocarbons, lactates, esters, non-protonic sulfoxides and/or nitriles.

More detailed illustrative, but non-limiting examples of the organic solvent include methanol, ethanol, propanol, isopropanol, butanol, pentanol, hexanol, ethylene glycol, propylene glycol, glycerol, ethylene glycol monomethyl ether, ethylene glycol monoethyl ether, ethylene glycol dimethyl ether, ethylene glycol diethyl ether, propylene glycol propyl ether, ethylene glycol monophenyl ether, ethylene glycol monoisopropyl ether, THF, propylene glycol methyl ether acetate, methyl isobutyl ketone, methyl ethyl ketone, hexadecane, pentadecane, tetradecane, tridecane, dodecane, undecane, decane, nonane, octane, heptanes, hexane, ethanolamine, methyl acetate, ethyl acetate, xylene, toluene, benzene, DMSO, and acetonitrile).

At this time, if the single organic solvent or the organic solvent in which two or more solvents are mixed with each other is a single organic solvent which has a solubility parameter in the range of the solubility parameter of the capping material±1.8 $(cal/cm^3)^{1/2}$ or a mixed organic solvent which has a mixed solubility parameter in the above range, they may be used as the solvent of the metal ink according to the present invention.

In addition, in the case of the organic solvent in which two or more solvents are mixed with each other, each of the organic solvent may be out of the range of the solubility parameter of the capping material±1.8 $(cal/cm^3)^{1/2}$, and it may be used without a particular limit if the solubility parameter of the mixed solvent that is calculated by using an average value according to a volume ratio is in the range of the allowed solubility parameter.

In the present invention, it is preferable that the metal nano particles are nano particles of a single metal selected from the group consisting of Ag, Au, Pd, Pt, Ni, Cu, Cr, Al, W, Zn, Fe and Pb, an alloy of two or more species, or metal oxides. The particle diameter of the metal nano particles may be 500 nm or less, preferably 200 nm or less, and more preferably 100 nm or less. The particle diameter of the metal nano particle is preferably 0.1 nm or more and more preferably 5 nm or more.

In addition, in the metal ink according to the present invention, the content of the metal nano particles is not particularly limited, but the metal nano particle may be contained in an amount in the range of 0.1~90 parts by weight on the basis of 100 parts by weight of the total metal ink, and preferably in an amount in the range of 0.1~70 parts by weight. If the metal nano particle may be contained in an amount of less than 0.1 parts by weight on the basis of 100 parts by weight of the total metal ink, it is impossible to form a wire or a film that has a sufficient thickness and conductivity. In addition, if the metal nano particle is included in an amount of more than 90 parts by weight, the fluidity of the metal ink is reduced, and the dispersibility in the solvent may be reduced.

In the present invention, the capping material is one or more selected from the group consisting of polyvinyl pyrolidone (PVP), polyethylene imine (PEI), polymethyl vinyl ether (PMVE), polyvinyl alcohol (PVA), polyoxyethylene alkyl phenyl ether, polyoxyethylene sorbitan monostearate, and a derivative thereof, but is not limited thereto. In addition, these capping materials may be used alone or as a mixture of two or more species.

In addition, in the metal ink according to the present invention, the content of the capping material is not particularly limited, but it may be included in an amount in the range of 0.01~10 parts by weight on the basis of 100 parts by weight of the total metal ink. If the capping material may be contained in an amount of less than 0.01 parts by weight on the basis of 100 parts by weight of the total metal ink, the dispersion effect of the metal nano particles in the organic solvent is weak, and if the capping material may be contained in an amount of more than 10 parts by weight, since the content of the solids is relatively reduced, the conductivity is reduced and the viscosity is increased, which is not undesirable.

In addition, the metal ink according to the present invention may further include a viscosity controlling agent. The viscosity controlling agent functions to control a viscosity of the metal ink so that the viscosity is suitable for operation. The viscosity controlling agent may be a general viscosity controlling agent that is known in the art.

On the other hand, the present invention provides a method for producing a metal wire by using the metal ink according to the present invention as described above, in detail, the method for producing the metal wire, which comprises the steps of jetting the metal ink according to the present invention by using an ink-jet nozzle; drying the metal ink; and firing the metal ink.

In the method for producing the metal wire according to the present invention, the firing may be carried out at a temperature in the range of 100~600° C., and the firing time may be in the range of several seconds to several hours, but is not particularly limited thereto.

By the above firing, the organic substance that is included in the metal ink for various purposes, that is, the organic solvent, the capping material and the like, are directly burnt out, or burnt out after they are decomposed, accordingly, because of the bonding between the remaining metal nano particles, the metal wire pattern may be formed.

In the method for producing the metal wire according to the present invention, the metal ink may be jetted on a substrate, and illustrative, but non-limiting examples of the substrate include a glass substrate, a transparent polymer substrate, a metal substrate, a flexible substrate or the like.

A better understanding of the present invention may be obtained in light of the following Examples. The Examples are set forth to illustrate, but are not to be construed to limit the present invention.

Example 1

The Ag nanoparticles that were capped with PVP (polyvinylpyrrolidone) produced by the polyol process were dispersed in an organic solvent to produce Ag ink. At this time, it was known that the solubility parameter of PVP was 11.9 $(cal/cm^3)^{1/2}$.

As the organic solvent, 1-buthanol having the solubility parameter of 11.32 $(cal/cm^3)^{1/2}$ was used as a single solvent. In addition, in the ink, the content of the Ag particle that was capped by PVP was 30 wt %, and the content of the organic solvent was 70 wt %. The mixture was shaken in the shaker for 2 hours to produce the ink.

Example 2

The ink was produced by using the same method as Example 1, except that 1-propanol having the solubility parameter of 11.97 $(cal/cm^3)^{1/2}$ was used alone instead of 1-buthanol as the organic solvent.

Example 3

The ink was produced by using the same method as Example 1, except that the mixture organic solvent having the solubility parameter of 11.69 $(cal/cm^3)^{1/2}$, which included ethanolamine having the solubility parameter of 15.44 $(cal/cm^3)^{1/2}$ and ethyl acetate having the solubility parameter of 9.07 $(cal/cm^3)^{1/2}$ mixed with each other at a ratio of 41% and 59% on the basis of the volume was used instead of 1-buthanol as the organic solvent.

Comparative Example 1

The ink was produced by using the same method as Example 1, except that ethanolamine having the solubility parameter of 15.44 $(cal/cm^3)^{1/2}$ was used alone instead of 1-buthanol as the organic solvent.

Comparative Example 2

The ink was produced by using the same method as Example 1, except that ethyl acetate having the solubility parameter of 9.07 $(cal/cm^3)^{1/2}$ was used alone instead of 1-buthanol as the organic solvent.

Comparative Example 3

The ink was produced by using the same method as Example 1, except that acetone having the solubility parameter of 9.75 $(cal/cm^3)^{1/2}$ was used alone instead of 1-buthanol as the organic solvent.

(Confirmation of Generation of the Precipitate in Ink)

In respects to the inks that were produced in Examples 1~3 and Comparative Examples 1~3, the occurrence of the precipitation was confirmed, and the results are shown in FIGS. 1 to 5.

As shown in FIGS. 1, and 3 to 5, the inks that were produced in Examples 1~3 were all stably dispersed without the precipitation of the Ag particles. On the other hand, in all the inks that were produced in Comparative Examples 1~3, it was confirmed that the precipitation was formed even though they were shaken for 2 hours. In the case of Comparative Example 1, as shown in FIGS. 2 and 3, a phenomenon in which agglomerates were attached to the wall was shown, and in the case of Comparative Example 2, as shown in FIGS. 2 and 4, since a complete phase separation occurs in the ink, it was confirmed that it was capable of being not used. In the case of Comparative Example 3, as shown in FIGS. 2 and 5, it was confirmed that a phase separation occurs at an upper part of the ink and the dispersion at the interface was unstable as compared to Example 3.

What is claimed is:

1. A metal ink comprising:
   metal nano particles that are capped by a capping material; and
   an organic solvent that has a solubility parameter for swelling the capping material,
   wherein the solubility parameter for swelling the capping material is in a range of solubility parameter of the capping material±1.8 $(cal/cm^3)^{1/2}$, and
   wherein the organic solvent is a mixed organic solvent of ethanolamine and ethyl acetate.

2. The metal ink as set forth in claim 1, wherein the solubility parameter for swelling the capping material is in a range of solubility parameters of the capping material±0.4 $(cal/cm^3)_{1/2}$.

3. The metal ink as set forth in claim 1, wherein the metal nano particles are nano particles of a single metal selected from the group consisting of Ag, Au, Pd, Pt, Ni, Cu, Cr, Al, W, Zn, Fe and Pb, an alloy of two or more species, or metal oxides.

4. The metal ink as set forth in claim 1, wherein the capping material is one or more selected from the group consisting of polyvinyl pyrollidone (PVP), polyethylene imine (PEI), polymethyl vinyl ether (PMVE), polyvinyl alcohol (PVA), polyoxyethylene alkyl phenyl ether and polyoxyethylene sorbitan monostearate.

5. The metal ink as set forth in claim 1, wherein the metal nano particles that are capped by the capping material are synthesized by using a polyol process.

6. The metal ink as set forth in claim 1, wherein the metal nano particles are dispersed in the organic solvent.

* * * * *